(12) United States Patent
Hsu et al.

(10) Patent No.: US 6,531,324 B2
(45) Date of Patent: Mar. 11, 2003

(54) MFOS MEMORY TRANSISTOR & METHOD OF FABRICATING SAME

(75) Inventors: Sheng Teng Hsu, Camas, WA (US); Fengyan Zhang, Vancouver, WA (US); Tingkai Li, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/820,039

(22) Filed: Mar. 28, 2001

(65) Prior Publication Data

US 2002/0177244 A1 Nov. 28, 2002

(51) Int. Cl.[7] .............................................. H01L 21/00
(52) U.S. Cl. .......................................... 438/3; 438/680
(58) Field of Search ........................... 438/3, 289, 231, 438/216, 259, 261, 270, 595, 301, 296, 271, 680, 393, 396, 239, 250, 253; 257/295–296

(56) References Cited

U.S. PATENT DOCUMENTS

| | | | | |
|---|---|---|---|---|
| 5,510,651 A | * | 4/1996 | Maniar et al. | 257/295 |
| 5,638,319 A | * | 6/1997 | Onishi et al. | 257/295 |
| 6,048,740 A | | 4/2000 | Hsu et al. | 438/3 |
| 6,054,355 A | * | 4/2000 | Inumiya et al. | 438/296 |
| 6,072,221 A | * | 6/2000 | Hieda | 257/344 |
| 6,194,752 B1 | * | 2/2001 | Ogasahara et al. | 257/295 |
| 6,251,763 B1 | * | 6/2001 | Inumiya et al. | 438/301 |
| 6,278,164 B1 | * | 8/2001 | Hieda et al. | 257/295 |
| 6,303,502 B1 | * | 10/2001 | Hsu et al. | 438/239 |

OTHER PUBLICATIONS

Article entitled, "Analyses of High Frequency Capacitance–Voltage Characteristics of Metal–Ferroelectrics–Insulator–Silicon Structure" by Kanashima et al., published in Jpn. J. Appl. Phys. vol. 38(1999) Pt.1, No. 4A, pp. 2044–2048.

Article entitled, "Electrical Properties of SrBi2O9/Insulator/Si Structures with Various Insulators" by Lee et al., published in Jpn. J. Appl. Phys. vol. 38(1999) Pt. 1–No. 4A, pp. 2039–2043.

Article entitled, "Preparation of SrBi2Ta2O9 Film at Low Temperatures and Fabrication of a Metal/Ferroelectric/Insulator/Semiconductor Field Effect Transistor Using Al/SrBi2Ta2O9/CeO2/Si(100)Structures" by Hirai et al., published in Jpn. J. Appl. Phys. vol. 36(1997) Pt. 1, No. 9B, pp. 5908–5911.

Article entitled, "Realization of Adaptive Learning Function in a Neuron Circuit Using Metal/Ferroelectric (SrBi2Ta2O9)/Semiconductor Field Effect Transistor (MFSFET)" by Yoon et al., published in Jpn. J. Appl. Phys. Part 1, No. 4B, Apr. 1999, pp 2289–2293.

* cited by examiner

Primary Examiner—David Nelms
Assistant Examiner—David Vu
(74) Attorney, Agent, or Firm—David C. Ripma; Matthew D. Rabdau; Scott C. Krieger

(57) ABSTRACT

A ferroelectric transistor gate structure with a ferroelectric gate and passivation sidewalls is provided. The passivation sidewalls serve as an insulator to reduce, or eliminate, the diffusion of oxygen or hydrogen into the ferroelectric gate. A method of forming the ferroelectric gate structure is also provided. The method comprises the steps of forming a sacrificial gate structure, removing the sacrificial gate structure, depositing passivation insulator material, etching the passivation insulator material using anisotropic plasma etching to form passivation sidewalls, depositing a ferroelectric material, polishing the ferroelectric material using CMP, and forming a top electrode overlying the ferroelectric material.

16 Claims, 5 Drawing Sheets

MFOS MEMORY TRANSISTOR & METHOD OF FABRICATING SAME

BACKGROUND OF THE INVENTION

This invention relates generally to semiconductor technology and more particularly to metal-ferroelectric-insulator semiconductor (MFIS) transistor structures, and methods of fabrication. An MFIS transistor is similar to an MFOS transistor, but is not limited to structures that use oxide as the insulator material.

Previously, single transistor ferroelectric memory transistors have utilized a ferroelectric electrode stack, comprising a ferroelectric gate with a top electrode. The device would be formed by depositing a ferroelectric material, followed by an overlying metal layer. The layers would then be plasma etched. Plasma etching degrades the ferroelectric properties of the ferroelectric gate, thereby reducing the reliability of the memory transistor. The ferroelectric material also needed to be passivated to prevent contamination from hydrogen. Passivation was also used to reduce unwanted interactions between the ferroelectric material and underlying oxide.

SUMMARY OF THE INVENTION

A ferroelectric transistor structure is provided comprising a ferroelectric gate overlying a semiconductor substrate. The ferroelectric gate has a bottom with a gate dielectric interposed between the bottom and the semiconductor substrate. The ferroelectric gate also has sides with adjacent passivation sidewalls, and a top covered with a top electrode. The top electrode, the passivation sidewalls and the gate dielectric serve to encapsulate the ferroelectric gate, thereby reducing, or eliminating, contamination due to oxygen, hydrogen or other contaminants.

A method of forming the ferroelectric gate structure of the present invention is also provided. A gate insulation material is formed over the substrate. A sacrificial gate structure is formed overlying the gate insulation material and removed to produce an open gate region. A passivation insulator is deposited over the substrate, including the open gate region. The passivation insulator is anisotropic plasma etched to form passivation sidewalls. A ferroelectric material is deposited over the substrate including the open gate region and then polished using CMP. A top electrode is then formed over the remaining ferroelectric material. The combination of the top electrode, the passivation sidewalls and the gate insulation serve to encapsulate and protected the ferroelectric material.

The gate insulator is preferably $ZrO_2$, zirconium silicate, Zr—Al—Si—O, $HfO_2$, hafnium silicate, Hf—Al—O, La—Al—O, lanthanum oxide $Ta_2O_5$, or other suitable high-k material. However, the gate insulator may also be silicon nitride, nitrogen implanted silicon dioxide, or silicon oxynitride.

The passivation sidewalls are preferably $TiO_2$, $Al_2O_3$, $TiAlO_x$, or $Si_3N_4$ The ferroelectric material is preferably PGO, PZT, SBT, SBO, SBTO, SBTN, STO, BTO, BLT, LNO, $YMnO_3$, or other suitable material.

The top electrode is preferably iridium, platinum, ruthenium, iridium oxide, platinum oxide, ruthenium oxide, or other suitable material.

DETAILED DESCRIPTION OF THE INVENTION

Figure 1:
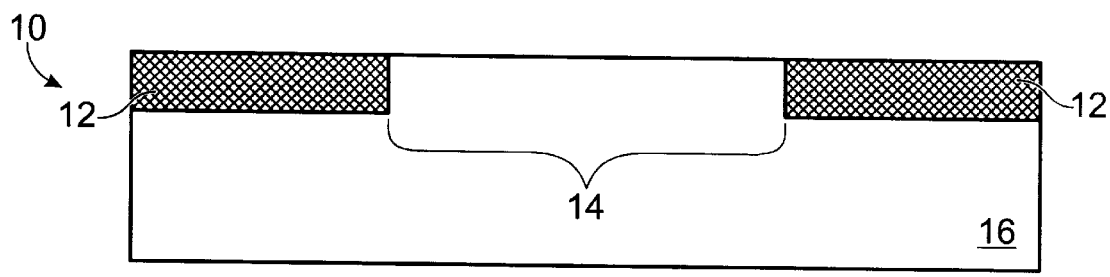
FIG. 1 is a cross-sectional view of a semiconductor substrate ready for further processing.

FIG. 1 shows a semiconductor structure 10 that has been prepared using state of the art processes. Shallow trench isolation (STI) has been used to produce isolation regions 12, and an active device region 14 on a substrate 16. Although an STI structure is shown, it would also be possible to use LOCOS isolation instead of STI. The semiconductor substrate is preferably silicon or silicon on insulator (SOI).

Figure 2:
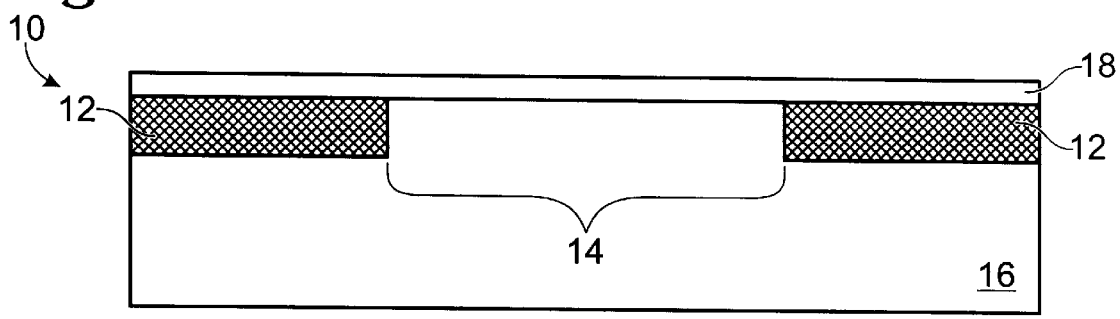
FIG. 2 is a cross-sectional view of the semiconductor substrate with a dielectric layer overlying the substrate.

FIG. 2 shows the semiconductor structure 10 following formation of a gate insulation material 18, which may also be referred to as the gate dielectric. The gate insulation material 18 is a metal oxide that does not react significantly with a ferroelectric material to be deposited in subsequent steps. Although the gate insulation material may be silicon dioxide, nitrogen implanted silicon dioxide, silicon nitride or silicon oxynitride, the gate insulation material 18 is preferably a high-k material. Zirconium oxide ($ZrO_2$) is currently the preferred material. Although $ZrO_2$ is preferred, other suitable high-k materials including, zirconium silicate, Zr—Al—Si—O, $HfO_2$, hafnium silicate, Hf—Al—O, La—Al—O, lanthanum oxide and $Ta_2O_5$ may be used.

If the gate insulation material is a high-k material, the gate insulation material 18 is preferably deposited to an equivalent thermal oxide thickness of between 0.5 nm and 10 nm. The equivalent thermal oxide thickness may have an actual thickness greater than that of silicon dioxide due to higher dielectric constants associated with these materials. The gate insulation material is preferably deposited to a thickness of between approximately 1 nm and 100 nm.

A variety of methods are available for depositing the gate insulation material 18. For silicon dioxide, the gate insulation material can be grown thermally and subsequently implanted as desired. In the case of other materials, which are deposited, the available deposition methods include chemical vapor deposition, including pulsed CVD, sputtering, or evaporation.

For example, $ZrO_2$ may be deposited using atomic layer deposition, also referred to as "pulsed CVD". Atomic layer deposition is used to deposit an extremely thin layer of material onto the substrate. Atomic layer deposition employs a chemical phenomenon known as chemisorption. In chemisorption, a material in a gas phase will adsorb to a surface saturating it, forming a monolayer. Most conventional deposition techniques employ physisorption processes, which produce multilayer deposition regions with a surface coverage that is purely statistical. By taking advantage of chemisorption, films can be grown that are extremely uniform in thickness and composition. For instance, $ZrO_2$ films have reportedly been grown this way on silicon by using zirconium chloride ($ZrCl_4$) to form the first monolayer, purging the system of $ZrCl_4$, and then exposing the surface to water vapor ($H_2O$). Other precursors for producing zirconium oxide layers include zirconium propoxide ($Zr(iOPr)_4$) and zirconium tetramethyl heptanedionato ($Zr(tmhd)_4$). Chemisorption occurs over a very limited range of temperature and pressures for a given gas-solid combination. For example, zirconium oxide has reportedly been deposited on silicon substrates at a temperature of 300 degrees Celsius using $ZrCl_4$ and $H_2O$. As the process produces a monolayer, thicker layers of zirconium oxide would be produced by adding additional monolayers.

$ZrO_2$ may also be deposited using the precursors identified above, as well as other precursors, in a more conventional CVD process.

An alternative deposition technique using conventional systems is to sputter targets to lay down a thin layer of high-k material. A sputtering target of high purity metal is used. A wafer is prepared and placed into a deposition chamber. The wafer is then heated to a temperature between room temperature and 500 degrees Celsius. A mixture of argon (Ar) and oxygen ($O_2$) is then introduced into the deposition chamber. A plasma with a sputtering power of between approximately 500 W and 5 kW is produced within the chamber. The zirconium shutter is opened to deposit zirconium over the wafer, and then closed. The presence of oxygen within the chamber will cause the target material to form $ZrO_2$ concurrently with the deposition on the wafer In another alternative embodiment of the deposition method of the present invention, evaporation of targets is used to deposit the thin layer. The basic process is substantially identical to the description provided above with regard to sputtering, except that instead of exposing the targets to a plasma, the targets are heated to a temperature of between approximately 1,000 and 2,000 degrees Celsius. As described above, shutters can be used to control the duration of the deposition.

Figure 3:
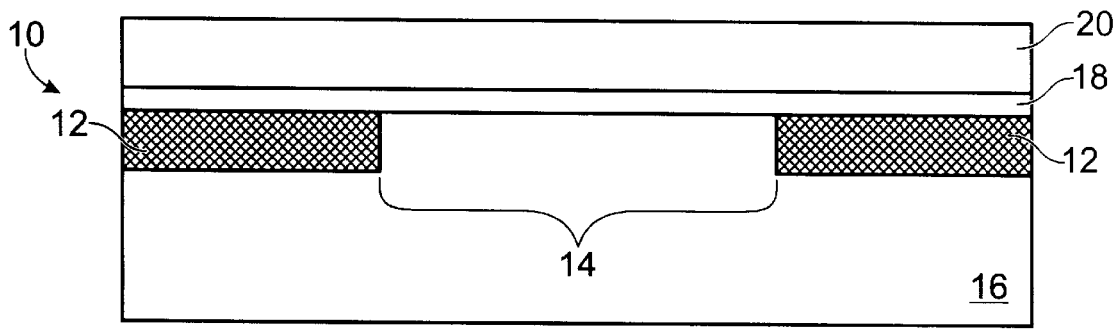
FIG. 3 is a cross-sectional view of the semiconductor substrate with a sacrificial layer overlying the dielectric layer.

FIG. 3 shows a sacrificial layer 20 deposited overlying the gate insulation material 18. The sacrificial layer is deposited to a thickness of between approximately 200 nm and 400 nm. The sacrificial layer is preferably silicon nitride or polysilicon. The sacrificial layer is preferably easy to remove by selective etching without affecting underlying or adjacent materials.

Figure 4:
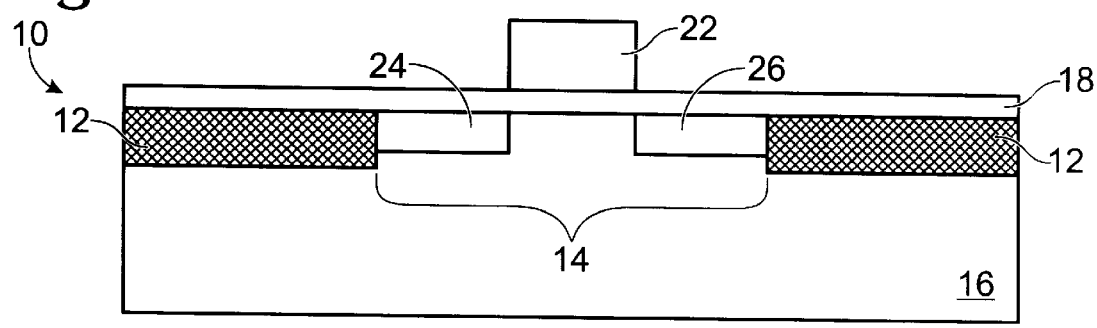
FIG. 4 is a cross-sectional view of the semiconductor substrate with a sacrificial gate structure overlying the dielectric layer.

FIG. 4 shows a sacrificial gate structure 22 formed by patterning the sacrificial layer using an overlying mask layer (not shown), and plasma etching the sacrificial layer. The plasma etch may stop at the gate insulation material. Alternatively, the plasma etch may partially, or completely, remove the gate insulation material from areas not covered by the mask pattern. A source region 24 and a drain region 26 are formed adjacent to the sacrificial gate structure 22. The source region 24 and the drain region 26 may be formed by any state of the art process, but preferably by ion implantation.

Figure 5:
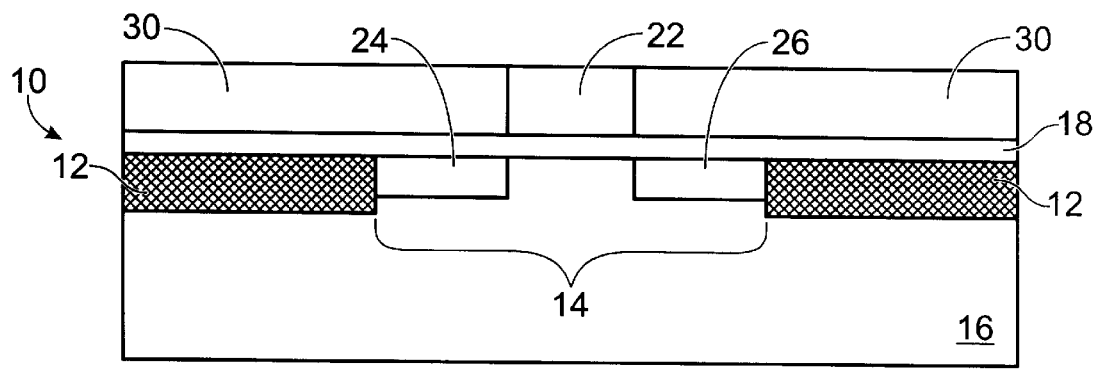
FIG. 5 is a cross-sectional view of the semiconductor substrate with the sacrificial gate structure surrounded by oxide.

FIG. 5 shows the semiconductor structure 10 following deposition of an oxide layer 30. The oxide layer 30 is deposited overlying the sacrificial gate structure and surrounding regions. The oxide layer 30 is deposited to a thickness at which the lowest portion of the oxide is at least as high as the sacrificial gate structure 22. This thickness is preferably 1 to 2 times the height of the sacrificial gate structure 22 above the substrate 16. Following deposition of the oxide layer it is polished using chemical-mechanical polishing (CMP) to expose the sacrificial gate structure 22. The CMP process is preferably stopped at the top of the sacrificial gate structure 22, without removing a significant portion of the sacrificial gate structure 22.

Figure 6:
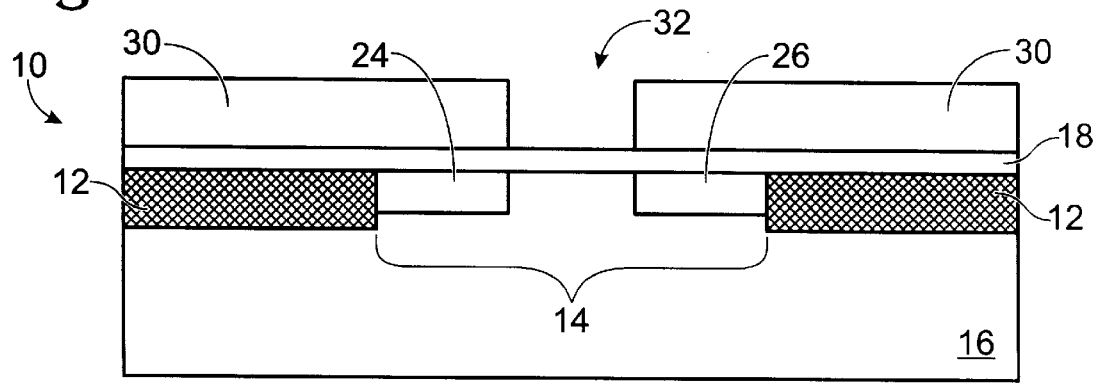
FIG. 6 is a cross-sectional view of the semiconductor substrate after the sacrificial gate is removed.

FIG. 6 shows the semiconductor structure 10 following removal of the sacrificial gate structure. The removal of the sacrificial gate structure leaves an open gate region 32. The sacrificial gate structure is preferably removed using a wet etch process.

Figure 7:
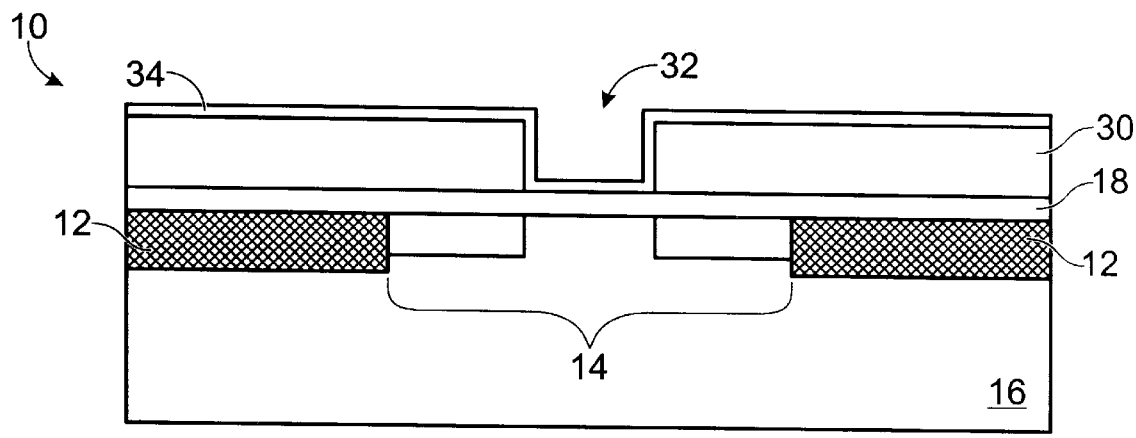
FIG. 7 is a cross-sectional view of the semiconductor substrate following deposition of a passivation insulator layer.

FIG. 7 shows the semiconductor structure 10 following deposition of a passivation insulator 34. The passivation insulator 34 is preferably selected from materials that will reduce, or eliminate, diffusion of oxygen or hydrogen through it. Preferred materials for forming the passivation insulator 34 are $TiO_2$, $Al_2O_3$, $TiAlO_x$, and $Si_3N_4$. The passivation insulator 34 may be deposited by sputtering or other suitable method known to one of ordinary skill in the art.

Figure 8:
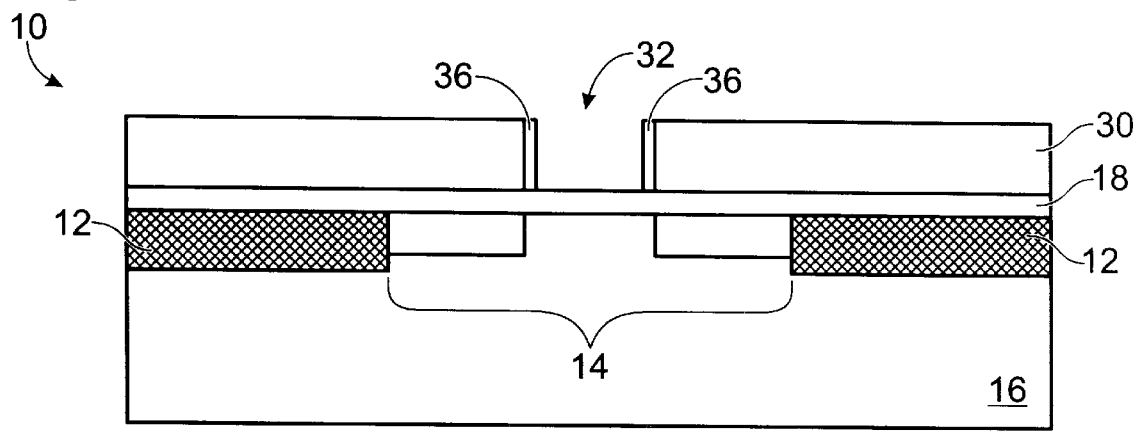
FIG. 8 is a cross-sectional view of the semiconductor substrate following anisotropic plasma etching of the passivation insulator layer.

FIG. 8 shows the semiconductor structure 10 following anisotropic plasma etching of the passivation insulator 34. The anisotropic etch removes the passivation insulator 34 from horizontal surfaces, leaving passivation sidewalls 36.

Figure 9:
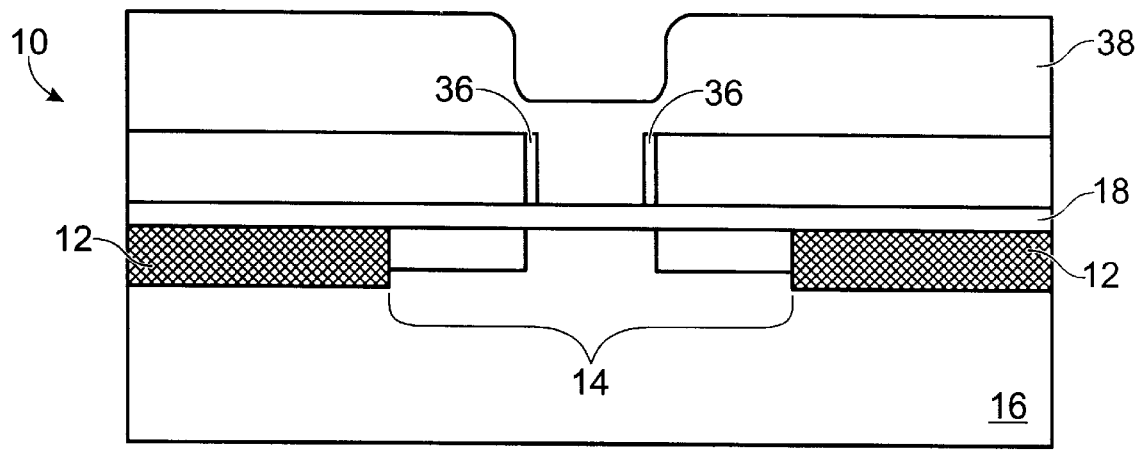
FIG. 9 is a cross-sectional view of the semiconductor substrate following deposition of a ferroelectric material layer.

FIG. 9 shows the semiconductor structure 10 following deposition of a ferroelectric material 38. The ferroelectric material fills the open gate region. Preferably, the ferroelectric material 38 is deposited to a thickness greater than the depth of the open gate region. The ferroelectric material 38 may be deposited by metal-organic chemical vapor deposition (MOCVD) or a chemical-solution deposition (CSD) process. The ferroelectric material is preferably selected from PGO, PZT, SBT, SBO, SBTO, SBTN, STO, BTO, BLT, LNO, and $YMnO_3$.

For example a PGO material, which may also be referred to as $Pb_5Ge_3O_{11}$, may be deposited using the following preferred method. The PGO material is deposited by metal organic vapor deposition (MOCVD) and RTP(Rapid Thermal Process) annealing techniques. The PGO material may be deposited at temperatures between 450 and 550° C.

An EMCORE oxide MOCVD reactor with liquid delivery system was used for the growth of PGO material. The precursors for the PGO material are listed in Table 1.

TABLE 1

The properties of precursors for PGO thin films

| Precursors | Formula | Vapor Pressure (mm Hg) | Decomposition Temperature (° C.) |
|---|---|---|---|
| Pb(TMHD)$_2$ | Pb(C$_{11}$H$_{19}$O$_2$)$_2$ | 180° C./0.05 | 325° C. |
| Ge(ETO)$_4$ | Ge(C$_2$H$_5$O)$_4$ | b.p. 185.5° C. | |

Liquid precursors such as germanium alkoxides, germanium halides, lead alkyls, and lead halides use a bubbler with a controlled temperature to generate precursor vapors. Solid precursors, such as lead B-diketonates, are dissolved in a solvent and use a liquid delivery system coupled with a flash vaporizer to generate precursor vapors. Table 2 is a list of PGO precursors that may be used in some aspects of the present invention.

TABLE 2

The properties of precursors for PGO films

| Precursor | Formula | Appearance at room temperature | Moisture stability | Vapor Pressure (mm Hg) | Decomposition Temp. (° C.) |
|---|---|---|---|---|---|
| Ge(ETO)$_4$ | GeH$_4$<br>Ge$_2$H$_6$<br>Ge$_3$H$_8$<br>Ge(OC$_2$H$_5$)$_4$ | colorless liquid | sensitive | 185° C. | |
| Pb Tetraphenyl | GeCl$_4$<br>(C$_2$H$_5$)$_2$GeCl$_2$<br>Pb(C6H5)4 | white powder | | 230° C./ 0.05 | 325° C. |
| Pb(TMHD)$_2$ | Pb(C$_{11}$H$_{19}$O$_2$)$_2$<br>Pb(C$_2$H$_5$)$_4$ | white powder | | 180° C./ 0.05 | 325° C. |

Table 3 is a list of solvents that are alternately available for use in some aspects of the present invention.

TABLE 3

The properties of solvents for PGO films

| Solvents | Formula | Boiling Temp. (° C.) |
|---|---|---|
| Tetrahydrofuran (THF) | C$_4$H$_8$O | 65–67° C. |
| Iso-propanol | C$_3$H$_7$OH | 97° C. |
| Tetraglyme | C$_{10}$H$_{22}$O$_5$ | 275° C. |
| Xylene | C$_6$H$_4$(CH$_3$)$_2$ | 137–144° C. |
| Toluene | C$_6$H$_5$CH$_3$ | 111° C. |
| Butyl ether | [CH$_3$(CH$_2$)$_3$]$_2$O | 142–143° C. |
| Butyl acetate | CH$_3$CO$_2$(CH$_2$)$_3$CH$_3$ | 124–126° C. |
| 2-Ethyl-1-hexanol | CH$_3$(CH$_2$)$_3$CH(C$_2$H$_6$)CH$_2$OH | 183–186° C. |

[Pb(thd)$_2$] and [Ge(ETO)$_4$] with a molar ratio of 5:3 were dissolved in a mixed solvent of tetrahydrofuran, isopropanol and tetraglyme in the molar ratio of 8:2:1. The precursor solutions have a concentration of 0.1 to 0.3 M/L of Pb$_5$Ge$_3$O$_{11}$. The solution was injected into a vaporizer (150° C.) by a pump at a rate of 0.1 ml/min to form precursor gases. The precursor gases were brought into the reactor using a preheated argon flow at 150–170° C. The deposition temperatures and pressure are 500° C. and 5–10 Torr separately. The shroud flow (Ar 4000 sccm) with oxygen (1000–2000 sccm) was led into the reactor. After deposition, the PGO material was cooled down to room temperature in an oxygen atmosphere. The PGO material may be annealed using RTP.

Alternatively, a CSD process may be used to deposit the ferroelectric material instead of MOCVD. One form of CSD process is a spin on method. For example, a PGO thin film may be deposited using the spin on method. The precursors are lead acetate and germanium iopropoxide in di (ethylene glycol) ethyl ether solution. The precursors are spun over the substrate and any overlying structures forming a film. The film is baked at 50 to 350 degrees Celsius for 1 to 10 minutes and pre-annealed after each spin coating at 400 to 500 degrees Celsius for 1 to 15 minutes to evaporate the solvent and eliminate the organic components. Each spin coating layer has a thickness of between about 10 nm and 100 nm. After several repetitions, the PGO film can be produced with a desired thickness. The PGO film is crystallized at 500 to 600 degrees Celsius for 5 minutes to 3 hours in oxygen ambient. Optimization of the process can be achieved for a desired film thickness, without undue experimentation.

Figure 10:
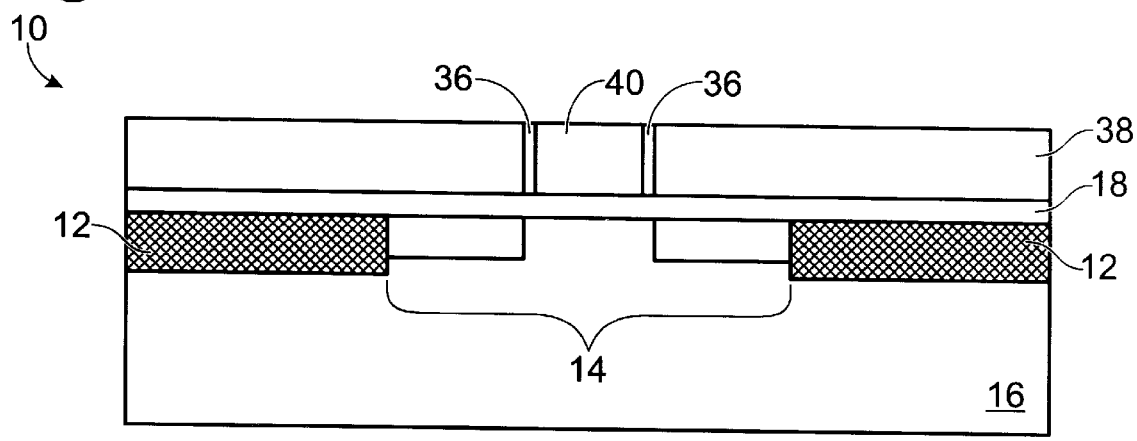
FIG. 10 is a cross-sectional view of the semiconductor substrate following chemical-mechanical polishing of the ferroelectric material layer.

FIG. 10 shows the semiconductor structure 10 following CMP of the ferroelectric material to produce a ferroelectric gate 40. The CMP process preferably stops at the top of the passivation sidewalls 36. Alternatively, the CMP process may extend slightly below the top of the passivation sidewalls 36.

Figure 11:
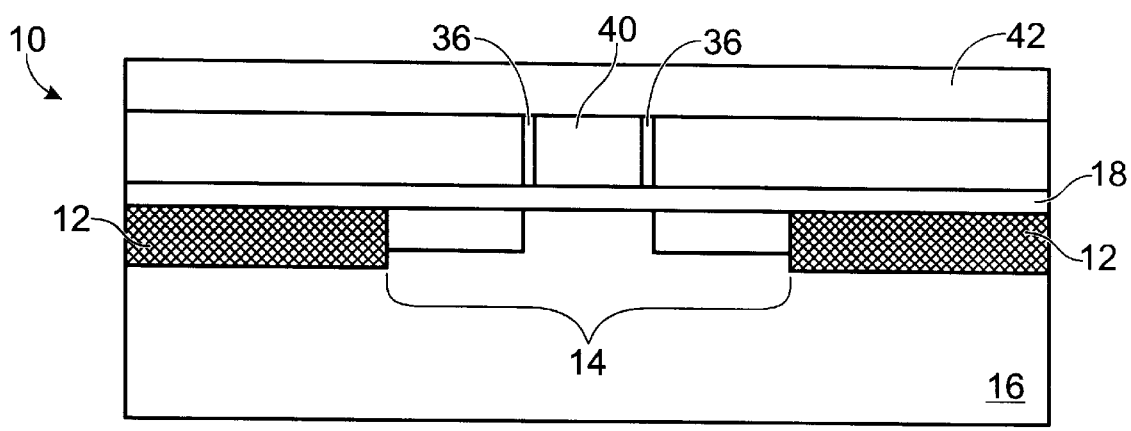
FIG. 11 is a cross-sectional view of the semiconductor substrate following deposition of a top electrode layer.
Figure 12:
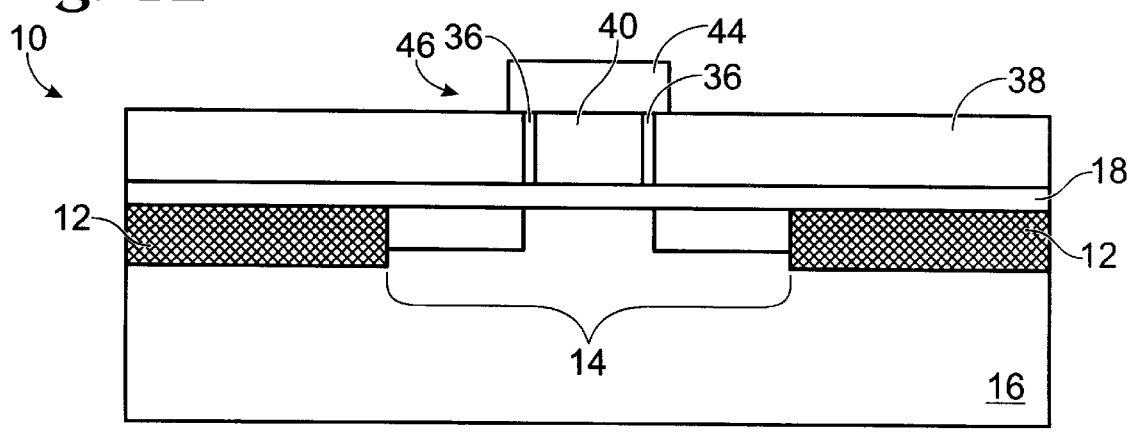
FIG. 12 is a cross-sectional view of the semiconductor substrate showing a top electrode.

FIG. 11 shows the semiconductor structure 10 following deposition of an electrode layer 42. The electrode layer 42 comprises iridium, platinum, ruthenium, or their oxides. The electrode layer 42 is patterned and etched to form a top electrode 44, as shown in FIG. 12. The electrode layer 42 may be patterned using photoresist or a hard mask material, such as TiN, TiO$_2$, TiAlO$_3$, SiO$_2$, SiN, or other suitable material. The electrode layer may be etched by plasma etching or other suitable etching process.

In an alternative embodiment, an inlaid, or damascene, method may be used to form the top electrode 44. A trench would be formed using a method similar to that used in forming the ferroelectric gate, which was described in detail above. A metal, such as iridium, platinum, ruthenium, or their oxides, would then be deposited into the trench and polished using CMP to form the top electrode 44.

FIG. 12 shows the semiconductor structure 10 with a ferroelectric gate structure 46. The ferroelectric gate structure 46 comprises the ferroelectric gate 40 protected by the gate insulation material 18 below, the passivation sidewalls 36 along the sides, and the top electrode 44 above. This will reduce, or eliminate, contamination of the ferroelectric gate 40 from oxygen or hydrogen diffusing into the ferroelectric gate 40.

Figure 13:
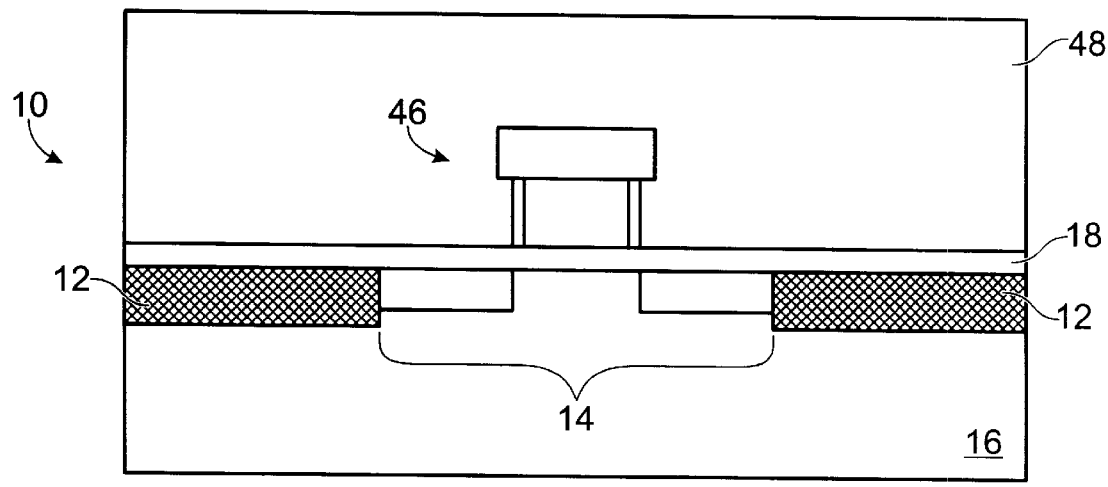
FIG. 13 is a cross-sectional view of the semiconductor substrate with a passivation layer overlying device structures.

FIG. 13 shows the semiconductor structure 10 with a passivation layer 48 deposited overlying the ferroelectric gate structure 46.

Figure 14:
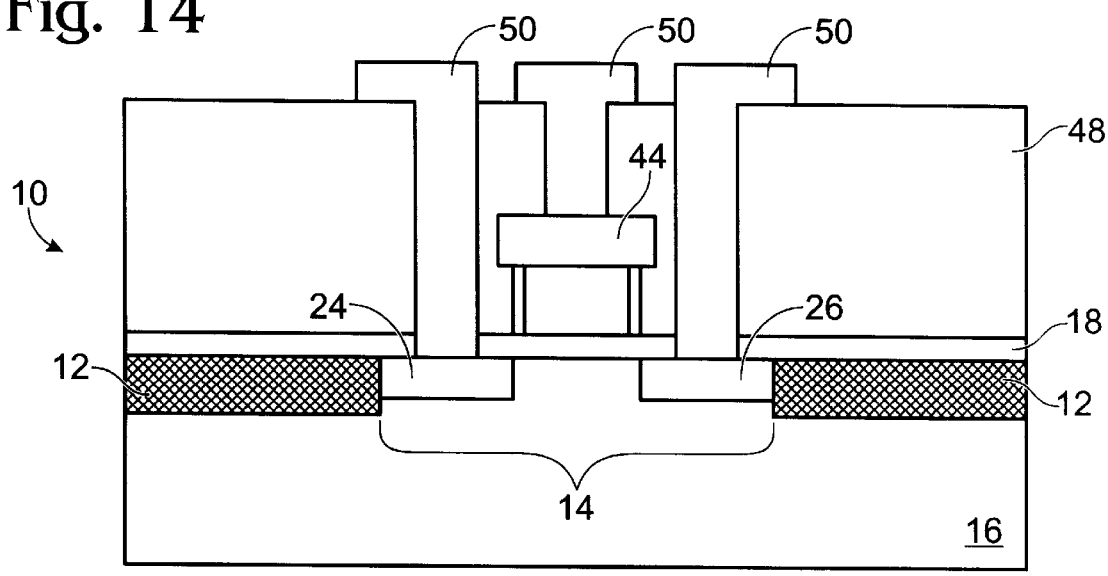
FIG. 14 is a cross-sectional view of the semiconductor substrate showing metal contacts to the device structures.

FIG. 14 shows the semiconductor structure 10 following final metallization using state of the art methods. Connections 50 to the source region 24, the drain region 26, and the top electrode 44 are shown as simplified structures. Any state of the art metallization scheme may be used, including copper metallization. The metallization may include barrier layers and other layers that are used in connection with various metallization schemes.

Although, metallization using deposition followed by etching is described above, it would also be possible to use a damascene metallization process instead. For example, use of the damascene metallization process is preferred for copper metallization.

What is claimed is:

1. A method of forming a ferroelectric transistor structure on a substrate comprising the steps of:
   a) forming a gate insulator over the substrate;
   b) producing a sacrificial gate structure overlying the substrate;
   c) removing the sacrificial gate structure to form a gate opening having a depth;
   d) depositing a passivation insulator over the substrate;
   e) etching the passivation insulator using anisotropic etching, whereby passivation sidewalls are formed;

f) depositing a ferroelectric material over the substrate to a thickness greater than the depth of the gate opening;

g) polishing the ferroelectric material using chemical-mechanical polishing (CMP), whereby a ferroelectric gate is formed; and h) forming a top electrode overlying the ferroelectric gate.

2. The method of claim 1, wherein the step of forming the sacrificial gate accomplished by the steps of:

a) depositing and patterning a layer of sacrificial gate material, whereby a sacrificial gate is formed;

b) forming an oxide overlying the sacrificial gate;

c) and polishing the oxide to expose the sacrificial gate.

3. The method of claim 2, wherein the layer of sacrificial gate material is silicon nitride or polysilicon.

4. The method of claim 2, wherein the step of polishing is accomplished using chemical-mechanical polishing (CMP).

5. The method of claim 1, wherein the step of depositing the gate insulator is accomplished by chemical vapor deposition (CVD), pulsed CVD, sputtering, or evaporation.

6. The method of claim 1, wherein the step of depositing the gate insulator deposits $ZrO_2$, zirconium silicate, Zr—Al—Si—O, $HfO_2$, hafnium silicate, Hf—Al—O, La—Al—O, lanthanum oxide or $Ta_2O_5$.

7. The method of claim 1, wherein the step of depositing the ferroelectric material is accomplished by metal-organic chemical vapor deposition (MOCVD), or chemical-solution deposition (CSD).

8. The method of claim 1, wherein the step of depositing the ferroelectric material deposits PGO, PZT, SBT, SBO, SBTO, SBTN, STO, BTO, BLT, LNO or $YMnO_3$.

9. The method of claim 1, wherein the top electrode is iridium, platinum, iridium oxide or platinum oxide.

10. The method of claim 1, wherein the step of forming the top electrode is accomplished by depositing and patterning a top electrode layer.

11. The method of claim 1, wherein the step of forming the top electrode is accomplished by using a damascene process.

12. The method of claim 1, wherein the step of depositing the passivation insulator deposits $TiO_2$, $Al_2O_3$, $TiAlO_x$, or $Si_3N_4$.

13. The method of claim 1, wherein the step of etching the passivation insulator is accomplished using anisotropic plasma etch.

14. The method of claim 1, wherein the step of depositing the gate insulator deposits $ZrO_2$, zirconium silicate, Zr—Al—Si—O, $HfO_2$, hafnium silicate, Hf—Al—O, La—Al—O, or lanthanum oxide.

15. The method of claim 1, wherein the step of depositing the ferroelectric material deposits PGO, SBTN, STO, BTO, BLT, LNO or $YMnO_3$.

16. The method of claim 1, wherein the step of depositing the passivation insulator deposits $TiO_2$, $Al_2O_3$, or $TiAlO_x$.

* * * * *